United States Patent
Zhang et al.

(10) Patent No.: US 10,510,549 B2
(45) Date of Patent: Dec. 17, 2019

(54) METHOD OF FABRICATING A METAL LAYER

(71) Applicant: UNITED MICROELECTRONICS CORP., Hsin-Chu (TW)

(72) Inventors: Shouguo Zhang, Singapore (SG); Hai Tao Liu, Singapore (SG); Ming Hua Du, Singapore (SG); Yen-Chen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/853,862

(22) Filed: Dec. 25, 2017

(65) Prior Publication Data

US 2019/0198334 A1   Jun. 27, 2019

(51) Int. Cl.
*H01L 21/3065* (2006.01)
*H01L 21/31* (2006.01)
*H01L 21/02* (2006.01)
*H01L 21/285* (2006.01)

(52) U.S. Cl.
CPC .... *H01L 21/3065* (2013.01); *H01L 21/02019* (2013.01); *H01L 21/02063* (2013.01); *H01L 21/31* (2013.01); *H01L 21/02266* (2013.01); *H01L 21/2855* (2013.01)

(58) Field of Classification Search
CPC .......... H01L 21/3065; H01L 21/02019; H01L 21/31; H01L 21/2855; H01L 21/02266; H01L 21/02063
See application file for complete search history.

(56) References Cited

U.S. PATENT DOCUMENTS

| | | | |
|---|---|---|---|
| 6,265,313 B1 | 7/2001 | Huang | |
| 7,049,226 B2 | 5/2006 | Chung | |
| 7,576,002 B2* | 8/2009 | Chen | H01L 21/2855 257/E21.169 |
| 8,668,816 B2 | 3/2014 | Ding | |
| 2004/0000478 A1* | 1/2004 | Guenzer | H01J 37/3266 204/298.18 |
| 2007/0249163 A1* | 10/2007 | Oikawa | H01L 21/76841 438/637 |
| 2008/0173931 A1* | 7/2008 | Ho | H01L 45/1273 257/324 |
| 2014/0091306 A1* | 4/2014 | Miki | H01L 29/458 257/59 |
| 2017/0117467 A1 | 4/2017 | Chang | |

* cited by examiner

*Primary Examiner* — Anita K Alanko
(74) *Attorney, Agent, or Firm* — Winston Hsu

(57) ABSTRACT

A method of fabricating a metal layer includes performing a first re-sputtering to remove a metal compound formed on a conductive layer. The first re-sputtering includes bombarding the metal compound and a dielectric layer on the conductive layer by inert ions and metal atoms. Then, a barrier is formed on the dielectric layer and the conductive layer. Later, a bottom of the barrier is removed. Subsequently, a metal layer is formed to cover the barrier.

12 Claims, 5 Drawing Sheets

METHOD OF FABRICATING A METAL LAYER

BACKGROUND OF THE INVENTION

1. Field of the Invention

The present invention relates to a method of fabricating a metal layer, and more particularly to a method of fabricating a metal layer including using a re-sputtering.

2. Description of the Prior Art

Modern integrated circuits are made up of millions of active devices such as transistors and capacitors. These devices are initially isolated from one another but are later interconnected together to form functional circuits. This interconnection process is called "metallization" and is performed using a number of different photolithographic, deposition, and removal techniques.

The interconnection process is achieved by forming recesses in the dielectric layer. These recesses are then filled with metals to connect devices or metal lines under the dielectric layer. During the formation of the metal lines or devices, metal oxides may be formed on the metal lines or devices. Furthermore, when etching the dielectric layer to forma recess and expose the metal line or devices under the dielectric layer, more metal oxide will grow on the metal line or devices. Therefore, before forming metal in the recess, the metal oxide should be removed.

A pre-cleaning process is conventionally used to remove the metal oxide. The pre-cleaning process will damage the dielectric constant of the dielectric layer, however.

SUMMARY OF THE INVENTION

Therefore, the present invention replaces the pre-cleaning process with a first re-sputtering process to overcome the disadvantage of the pre-cleaning process.

According to a preferred embodiment of the present invention, a method of fabricating a metal layer, comprises: providing a conductive layer, a metal compound contacting a top surface of the conductive layer, a dielectric layer covering the conductive layer, and a trench disposed in the dielectric layer and the metal compound exposed through the trench. Later, a first re-sputtering is performed on the metal compound and the dielectric layer with inert ions and metal ions, wherein the metal compound is removed entirely during the first re-sputtering. After the first re-sputtering, a barrier is formed to cover the trench. Then, a second re-sputtering is performed on the barrier with the inert ions and the metal ions, wherein the barrier at a bottom of the trench is entirely removed during the second re-sputtering. Finally, a metal layer is formed in the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a method of fabricating a metal layer according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5
FIG. 7 is a fabricating stage following FIG. 6;
and
FIG. 8 is a fabricating stage following FIG. 7.

DETAILED DESCRIPTION

Figure 1:
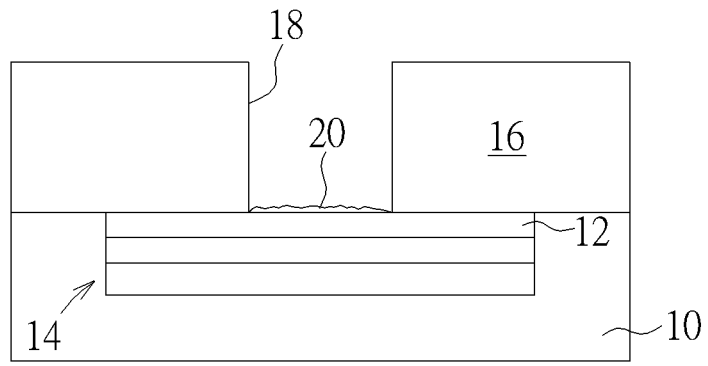
Figure 7:
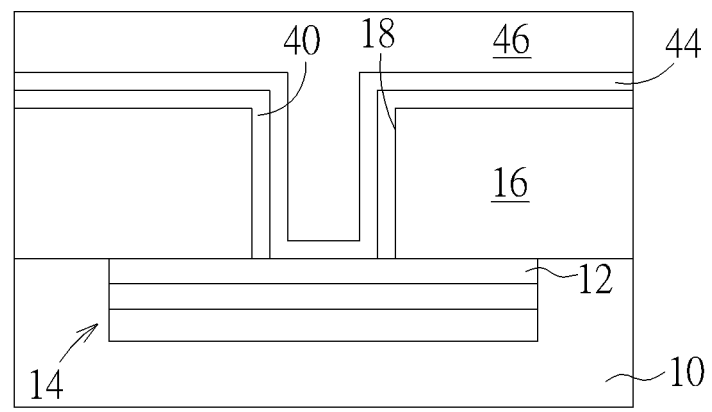
Figure 8:
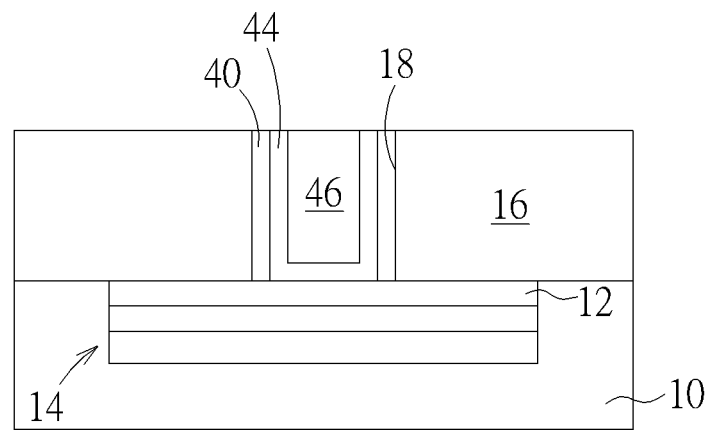
Figure 9:
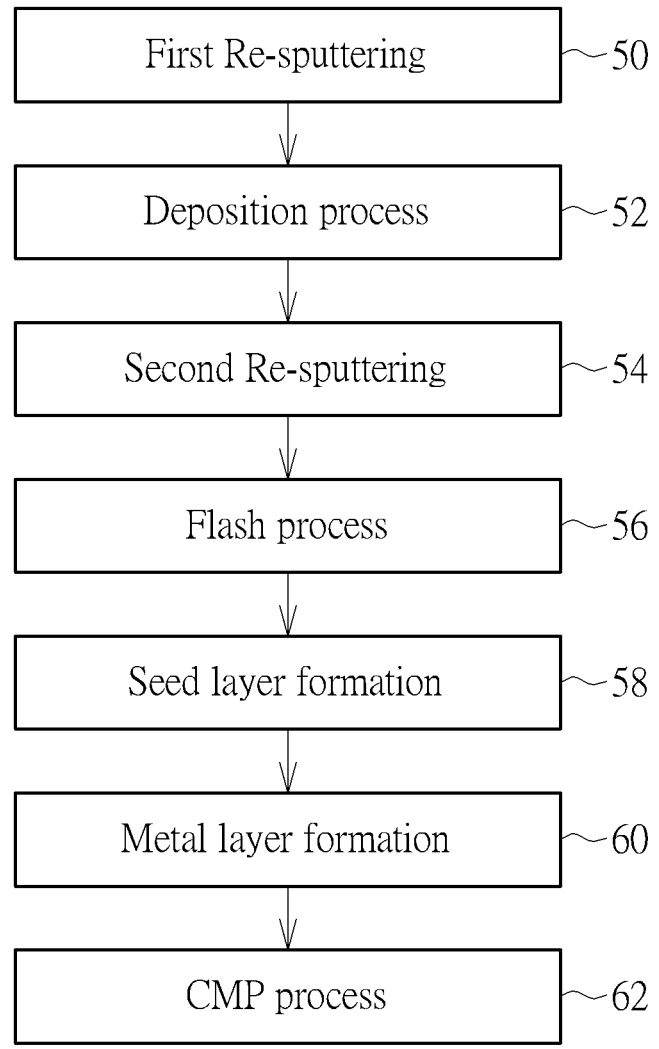
FIG. 9 is a flow chart illustrating a method of fabricating a metal layer of the present invention.

FIG. 1 to FIG. 8 depict a method of fabricating a metal layer of the present invention. FIG. 9 is a flow chart illustrating a method of fabricating a metal layer of the present invention. As shown in FIG. 1, a substrate 10 is provided. Initially, a conductive layer 12 is formed within the substrate 10. The conductive layer 12 may be tungsten, copper, aluminum, tantalum nitride or other conductive materials. The conductive layer 12 may be part of a metal interconnection or a top electrode of a resistive random-access memory 14. In this embodiment, the conductive layer 12 serves as a top electrode of a resistive random-access memory 14. The substrate 10 may be a dielectric layer such as silicon nitride, silicon oxynitride, silicon oxide, boro-phospho-silicate-glass or other insulating material formed on a semiconductor wafer. The substrate 10 may include other functional devices. Later, a dielectric layer 16 is formed to cover the conductive layer 12. The dielectric layer 16 can be silicon oxide, fluorine doped silicate glass (FSG) or low-k dielectric layer having a dielectric constant less than 4. Subsequently, the dielectric layer 16 is etched to form a trench 18, and the conductive layer 12 is exposed through the trench 18. Because the conductive layer 12 is exposed, the surface of the conductive layer 12 will be oxidized or react with other chemicals. Therefore, a metal compound 20 such as metal oxide, metal nitride, or metal oxynitride is formed on the top surface of the conductive layer 12. According to a preferred embodiment of the present invention, the conductive layer 12 is tantalum nitride and the metal compound is tantalum oxynitride.

Figure 2:
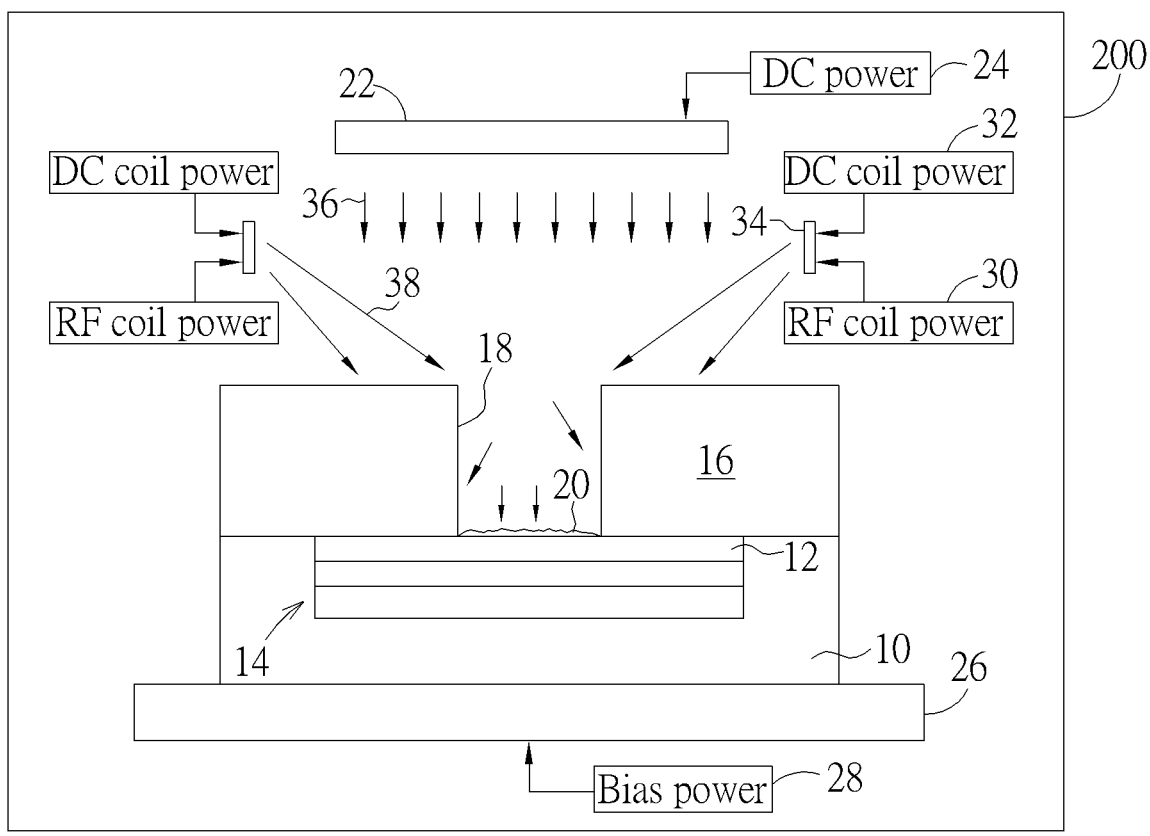

As shown in FIG. 2, the substrate 10 is transferred into a chamber 200 for plasma treatment. In the chamber 200, a metal target 22 of a preselected material is mounted on the top of the chamber 200 and is electrically connected to a DC power 24. The metal target 22 may be copper, aluminum, titanium, tantalum or other metals. In this embodiment, the metal target 22 is preferably tantalum. The substrate 10 is disposed on a substrate support 26 opposite to the metal target 22. The substrate support 26 is electrically connected to a bias power 28. An RF coil power 30 and a DC coil power 32 are electrically connected to a metal plate 34 on the sidewall of the chamber 200. The metal plate 34 is preferably made of the same metal as the metal target 22.

Continue to refer to FIG. 2 and FIG. 9. A first re-sputtering 50 is performed to bombard the metal compound 20 and the dielectric layer 16 with inert ions and metal ions. During the first re-sputtering 50, the metal compound 20 is removed by the inert ions entirely. In detail, during the first re-sputtering 50, an inert gas such as argon is ionized to bombard the metal target 22 and the metal plate 34, and then the metal ions are ejected from the metal target 22 and the metal plate 34. Also during the first re-sputtering 50, inert ions and the metal ions are directed to bombard the dielectric layer 16 and the metal compound 20 in a vertical direction 36 and a tilted direction 38. After the metal compound 20 is removed entirely, the conductive layer 12 will be exposed. It is noteworthy that the bombardment of the inert ions damages the surface of the exposed conductive layer 12 and the dielectric layer 16.

More specifically speaking, inert ions are attracted to the metal target 22 under the influence of the bias provided by the DC power 24. The inert ions also attracted to the metal plate 34 under the influence of the bias provided by the DC coil power 32 and the RF coil power 30. The inert ions hit the metal target 22 and the metal plate 34 to form metal ions. The bias power 28 bias the substrate support 26 with respect to the plasma and provides an electric field to attract the metal ions and inert ions to the exposed conductive layer 12 and the dielectric layer 16. Furthermore, the bombard energy is controlled by the bias power 28. Moreover, the metal ions will turn into metal atoms and form a deposition layer (not shown) when reaching the surface of the dielectric layer 16 and the exposed conductive layer 12. The thickness of the deposition layer is controlled by the DC power 24. The larger the DC power 24, the more metal atoms will be deposited at the surface of the exposed conductive layer 12 and the dielectric layer 16. More deposition of the metal atoms can better fix the damaged conductive layer 12 and the dielectric layer 16.

When the inert ions bombard the metal compound 20 to remove the metal compound 20, the surfaces of the dielectric layer 16 and the conductive layer 12 are damaged. Therefore, the metal atoms are deposited on the damaged dielectric layer 16 and the damaged conductive layer 12 to fix them. To sum up, the first re-sputtering 50 can remove the metal compound 20 entirely, and fix the surface damaged by the inert ions at the same time by bombarding the exposed conductive layer 12 and the dielectric layer 16 with the metal ions. During the first re-sputtering 50, the metal ions and the inert ions bombarding the exposed conductive layer 12 and the dielectric layer 16 in the vertical direction 36 and the tilted direction 38. The inert ions remove the metal compound 20, and the metal ions fix the sidewall of the dielectric layer 16. According to a preferred embodiment of the present invention, the bias power 28 is between 0 and 1200 watts. The DC power 24 is between 0 and 10000 watts. The DC coil power 32 is between 500 and 3000 watts. The RF coil power 30 is between 500 and 3000 watts.

Figure 3:
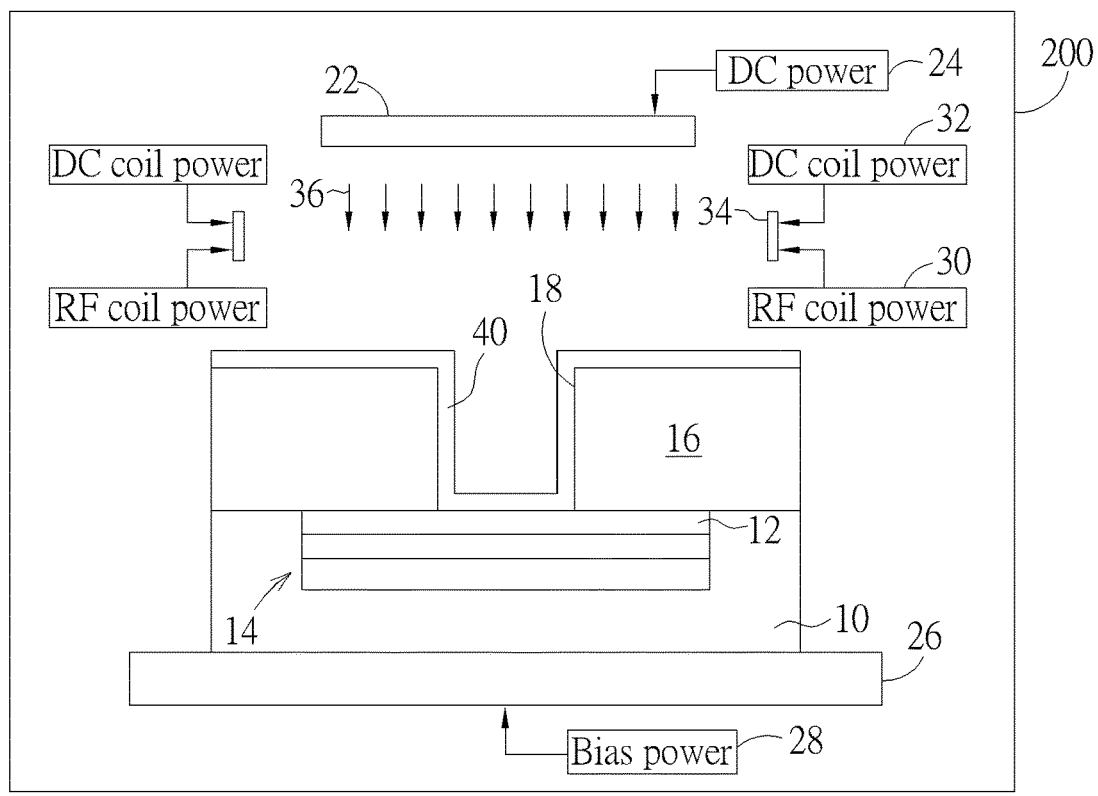

As shown in FIG. 3 and FIG. 9, a deposition process 52 is performed to forma barrier 40 covering the trench 18. The deposition process 52 is still performed in the chamber 200. In the deposition process 52, the DC coil power 32 and the RF coil power 30 are preferably turned off. That is, the inert ions and the metal ions only bombard the dielectric layer 16 and the conductive layer 12 in the vertical direction 36. The barrier 40 preferably includes tantalum or tantalum nitride. In detail, the barrier 40 can be formed by depositing a tantalum layer following by nitriding part of the tantalum layer to become a tantalum nitride layer. Therefore, the barrier 40 preferably includes tantalum and tantalum nitride. During deposition process 52, the bias power 28 is preferably around 10000 watts.

Figure 4:
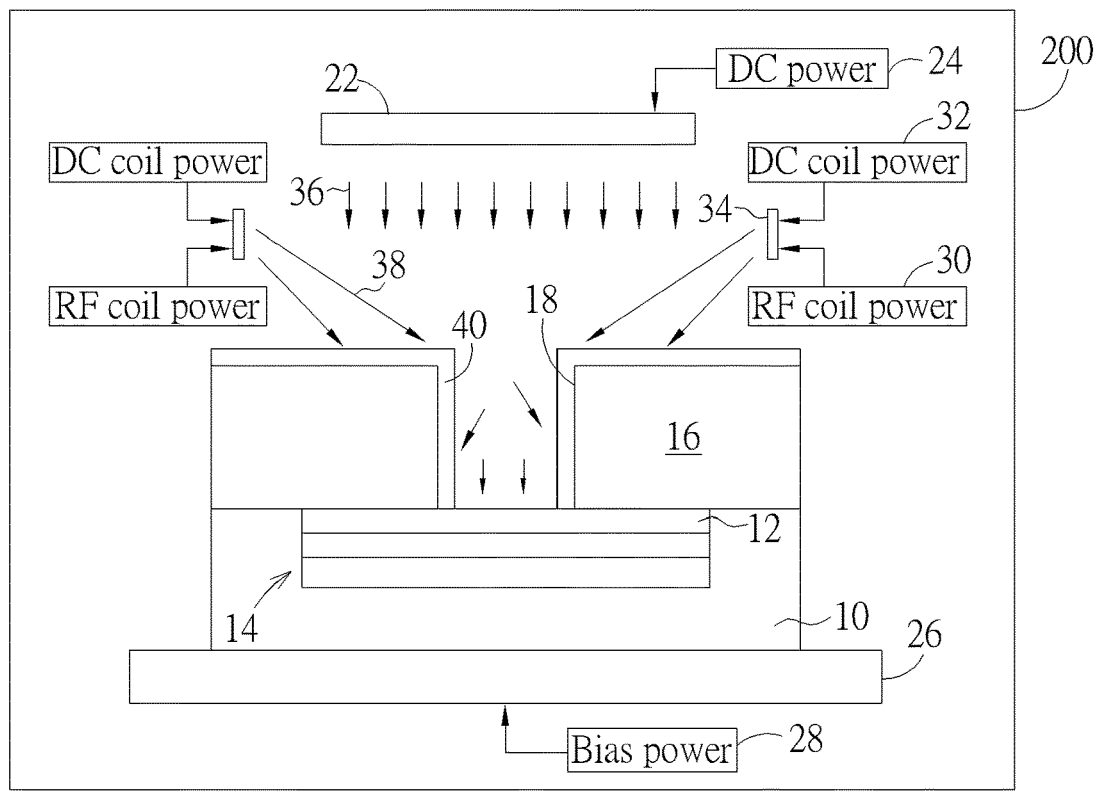

As shown in FIG. 4 and FIG. 9, a second re-sputtering is 54 performed by bombarding the barrier 40 with the inert ions and the metal ions. The second re-sputtering 54 is still performed in the chamber 200. The barrier 40 at a bottom of the trench 18 is entirely removed during the second re-sputtering 54. After removing the barrier 40 at the bottom of the trench 18, the conductive layer 12 is exposed, and the surface of the conductive layer 12 may be damaged by the inert ions. Similarly to the first re-sputtering 50, in the second re-sputtering 54, the inert ions are still argon ions, and the metal atoms are still tantalum atoms. The inert ions are used to remove the barrier 40 at the bottom of the trench 18. The metal ions are used to fix the damaged surface of the barrier 40 and the exposed conductive layer 12 by depositing the metal atoms.

It is noteworthy that the metal ions used in the first re-sputtering 50 and the second re-sputtering 54 are both formed from the metal target 22 and the metal plate 34 including a metal. The barrier 40 includes the same metal in the metal target 22. For example, if the metal target 22 and the metal plate 34 are tantalum, the barrier 40 is tantalum as well.

The second re-sputtering 54 can remove the barrier 40 at the bottom of the trench 18 entirely by bombarding the barrier 40 with the inert ions, and fix the surface damaged by the inert ions at the same time by bombarding the barrier 40 and the exposed conductive layer 12 by the metal ions. The inert ions and the metal ions in the second re-sputtering 54 are also ejected in the vertical direction 34 and the tilted direction 38. According to a preferred embodiment of the present invention, in the second re-sputtering 54, the bias power 38 is between 0 and 1200 watts. The DC power 24 is between 0 and 2000 watts. The DC coil power 32 is between 0 and 2000 watts. The RF coil power 30 is between 0 and 2000 watts.

During the second re-sputtering 54, the sidewall of the dielectric layer 16 is already covered by the barrier 40; therefore, the inert ions bombarding in a direction towards the sidewall of the dielectric layer 16 will encounter the barrier 40 before they reach the dielectric layer 16. In this way, in the second re-sputtering 54, fewer metal atoms are needed in the tilted direction 38 to fix the dielectric layer 16. Because fewer metal atoms are needed in the tilted direction 38 in the second re-sputtering 54, the DC coil power 32 in the second re-sputtering 54 is lower than the DC coil power 32 in the first re-sputtering 50, and the RF coil power 30 in the second re-sputtering 54 is lower than the RF coil power 30 in the first re-sputtering 50. Furthermore, the DC power 24 controls the amount of the metal atoms deposited on the exposed conductive layer 12. In the first re-sputtering 50, the exposed conductive layer 12 is damaged more than in the second re-sputtering 54. Therefore, the DC power 24 in the first re-sputtering 50 is higher than the DC power 24 in the second re-sputtering 54.

Figure 5:
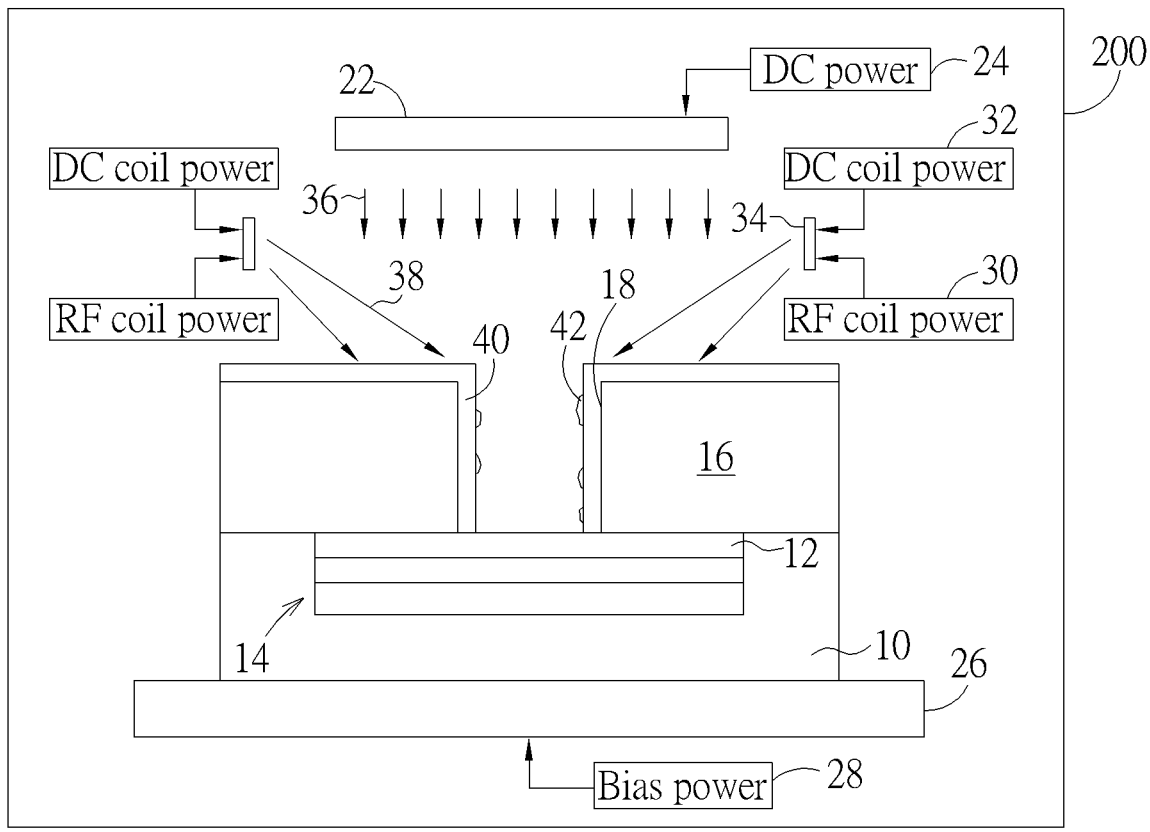
Figure 6:
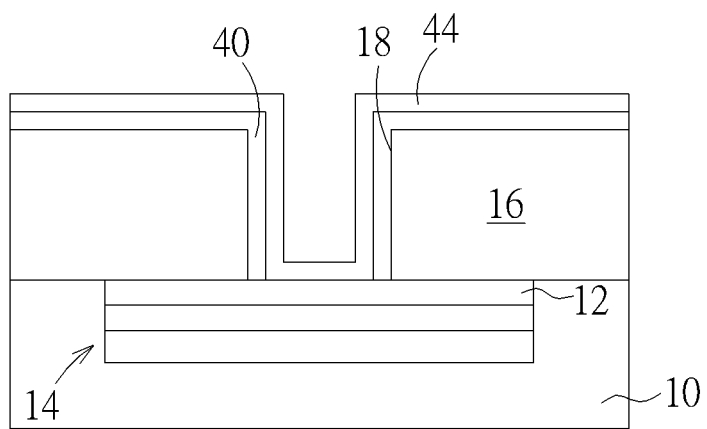

As shown in FIG. 5 and FIG. 9, after the second re-sputtering 54, some residue 42 is formed on the barrier 40. A flash process 56 is performed in the chamber 200 to remove residue 42 on the barrier 40. As shown in FIG. 6 and FIG. 9, the substrate 10 is moved out from the chamber 200. Later, a seed layer formation process 58 is performed to form a seed layer 44 on the barrier 40 and lines the barrier 40. As shown in FIG. 7 and FIG. 9, a metal layer formation process 60 is performed to form a metal layer 46 in the trench 18 on the seed layer 44. The metal layer 46 may be copper, tungsten, aluminum or other metals which are deposited by electroplating, and the seed layer 44 is deposited on the barrier 40 to act as an electrode for the electroplating process. Processes such as electroless, physical vapor, and chemical vapor deposition may be used to deposit the seed layer 44. The seed layer 44 and the metal layer 46 are of the same metal. As shown in FIG. 8 and FIG. 9, a chemical-mechanical polishing (CMP) process 62 is used to remove the metal layer 46, the seed layer 44, and the barrier 40 above the dielectric layer 16. At this point, the metal layer 46 of the present invention is completed.

The present invention utilizes the first re-sputtering to remove the metal compound by inert ions, and during removing of the metal compound, the damaged conductive layer and the damaged dielectric layer are fixed by the metal atoms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a metal layer, comprising:
   providing a conductive layer, a metal compound contacting a top surface of the conductive layer, a dielectric layer covering the conductive layer, and a trench disposed in the dielectric layer, the metal compound being exposed through the trench;
   performing a first re-sputtering on the metal compound and the dielectric layer with inert ions and metal ions, wherein the metal compound is removed entirely during the first re-sputtering, wherein during the first re-sputtering, the metal ions bombard the surface of the dielectric layer, and turn into metal atoms to deposit onto the surface of the dielectric layer;
   after the first re-sputtering, forming a barrier covering the trench, wherein the barrier is formed in a chamber;
   performing a second re-sputtering on the barrier with the inert ions and the metal ions, wherein the barrier at a bottom of the trench is entirely removed during the second re-sputtering and the second re-sputtering is performed in the chamber; and
   forming a metal layer in the trench.

2. The method of fabricating a metal layer of claim 1, wherein the metal ions used in the first re-sputtering and the second re-sputtering are both formed from a metal target and a metal plate, the metal target and the metal plate comprises a metal, and the barrier comprises the same metal in the metal target.

3. The method of fabricating a metal layer of claim 1, further comprising:
   before the second re-sputtering, nitriding part of the barrier.

4. The method of fabricating a metal layer of claim 1, further comprising:
   after performing a second re-sputtering, performing a flash process to remove residue on the barrier formed during the second re-sputtering; and
   after the flash process and before forming the metal layer, forming a seed layer on the barrier.

5. The method of fabricating a metal layer of claim 1, wherein the metal layer comprises copper or aluminum, the inert ions are argon ions, and the metal atoms are tantalum ions.

6. The method of fabricating a metal layer of claim 1, wherein the conductive layer comprises tungsten, copper, aluminum, tantalum nitride.

7. The method of fabricating a metal layer of claim 1, wherein the metal compound comprises tungsten oxide, copper oxide, aluminum oxide, or tantalum oxynitride.

8. The method of fabricating a metal layer of claim 1, wherein the conductive layer serves as a top electrode of a resistive random-access memory.

9. The method of fabricating a metal layer of claim 1, wherein both the first re-sputtering and the second re-sputtering are performed within a chamber comprising:
   a DC coil power connecting a metal plate on a sidewall of the chamber;
   an RF coil power connecting the metal plate; and
   a DC power connecting a metal target at a top of the chamber.

10. The method of fabricating a metal layer of claim 9, wherein a DC coil power in the first re-sputtering is higher than a DC coil power in the second re-sputtering.

11. The method of fabricating a metal layer of claim 9, wherein an RF coil power in the first re-sputtering is higher than an RF coil power in the second re-sputtering.

12. The method of fabricating a metal layer of claim 9, wherein a DC power in the first re-sputtering is higher than a DC power in the second re-sputtering.

* * * * *